(12) United States Patent
Miller, Jr. et al.

(10) Patent No.: US 7,348,256 B2
(45) Date of Patent: Mar. 25, 2008

(54) METHODS OF FORMING REDUCED ELECTRIC FIELD DMOS USING SELF-ALIGNED TRENCH ISOLATION

(75) Inventors: Gayle W. Miller, Jr., Colorado Springs, CO (US); Volker Dudek, Brackenheim (DE); Michael Graf, Leonberg (DE)

(73) Assignee: Atmel Corporation, San Jose, CA (US)

( * ) Notice: Subject to any disclaimer, the term of this patent is extended or adjusted under 35 U.S.C. 154(b) by 337 days.

(21) Appl. No.: 11/188,921

(22) Filed: Jul. 25, 2005

(65) Prior Publication Data

US 2007/0018273 A1    Jan. 25, 2007

(51) Int. Cl.
*H01L 21/76* (2006.01)

(52) U.S. Cl. ............... 438/435; 438/424; 257/496; 257/491; 257/E21.546

(58) Field of Classification Search ............... 438/424; 257/201, 211
See application file for complete search history.

(56) References Cited

U.S. PATENT DOCUMENTS 5,851,864 A    12/1998    Ito et al. ............... 438/203

2004/0038467 A1    2/2004    Darwish et al. ............ 438/197
2005/0093047 A1*   5/2005    Goda et al. ................ 257/300
2005/0285219 A1*  12/2005    Sakagami .................. 257/500
2006/0008993 A1*   1/2006    Song et al. ................ 438/268
2006/0134845 A1*   6/2006    Pham et al. ................ 438/200

* cited by examiner

*Primary Examiner*—Jerome Jackson
*Assistant Examiner*—Paul Budd
(74) *Attorney, Agent, or Firm*—Schneck & Schneck; Thomas Schneck

(57) ABSTRACT

A method of fabricating an electronic device and the resulting electronic device. The method includes forming a gate oxide on an uppermost side of a silicon-on-insulator substrate; forming a first polysilicon layer over the gate oxide; and forming a first silicon dioxide layer over the first polysilicon layer. A first silicon nitride layer is then formed over the first silicon dioxide layer followed by a second silicon dioxide layer. Shallow trenches are etched through all preceding dielectric layers and into the SOI substrate. The etched trenches are filled with another dielectric layer (e.g., silicon dioxide) and planarized. Each of the preceding dielectric layers are removed, leaving an uppermost sidewall area of the dielectric layer exposed for contact with a later-applied polysilicon gate area. Formation of the sidewall area assures a full-field oxide thickness thereby producing a device with a reduced-electric field and a reduced capacitance between gate and drift regions.

21 Claims, 18 Drawing Sheets

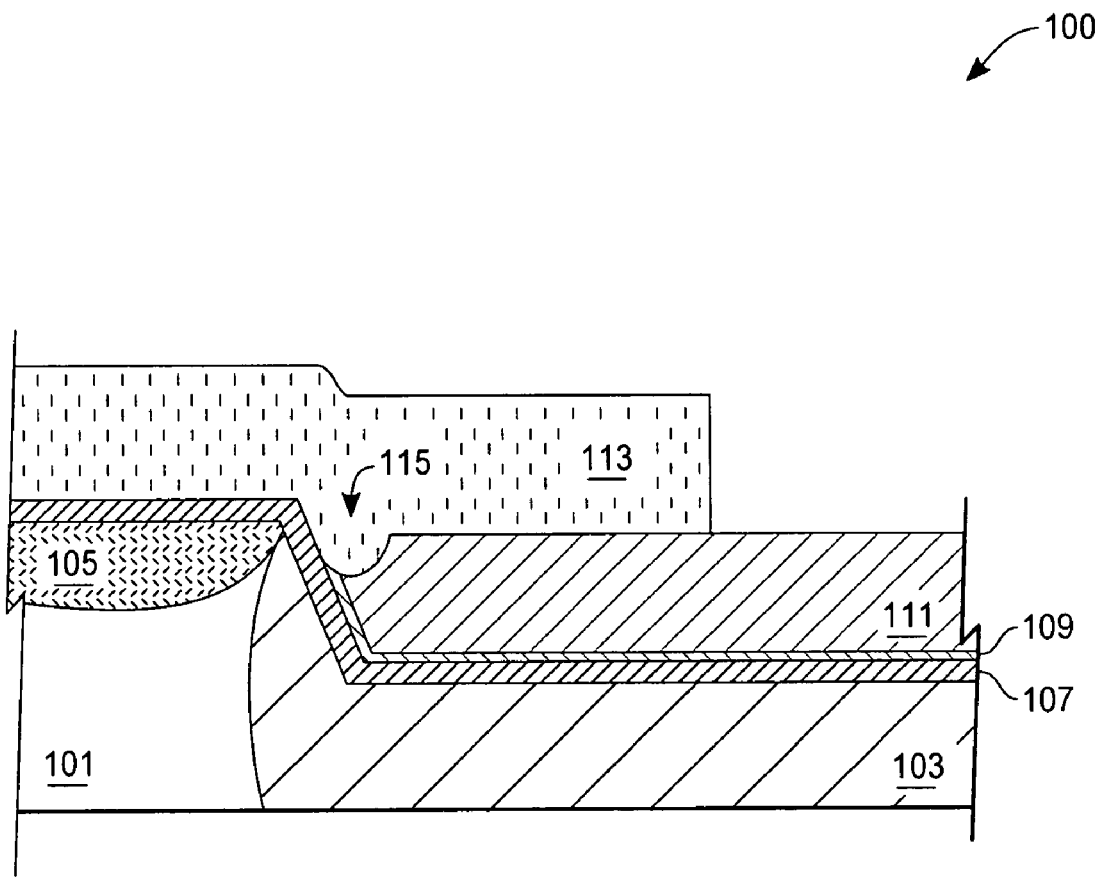
Fig. _ 1 (Prior Art)

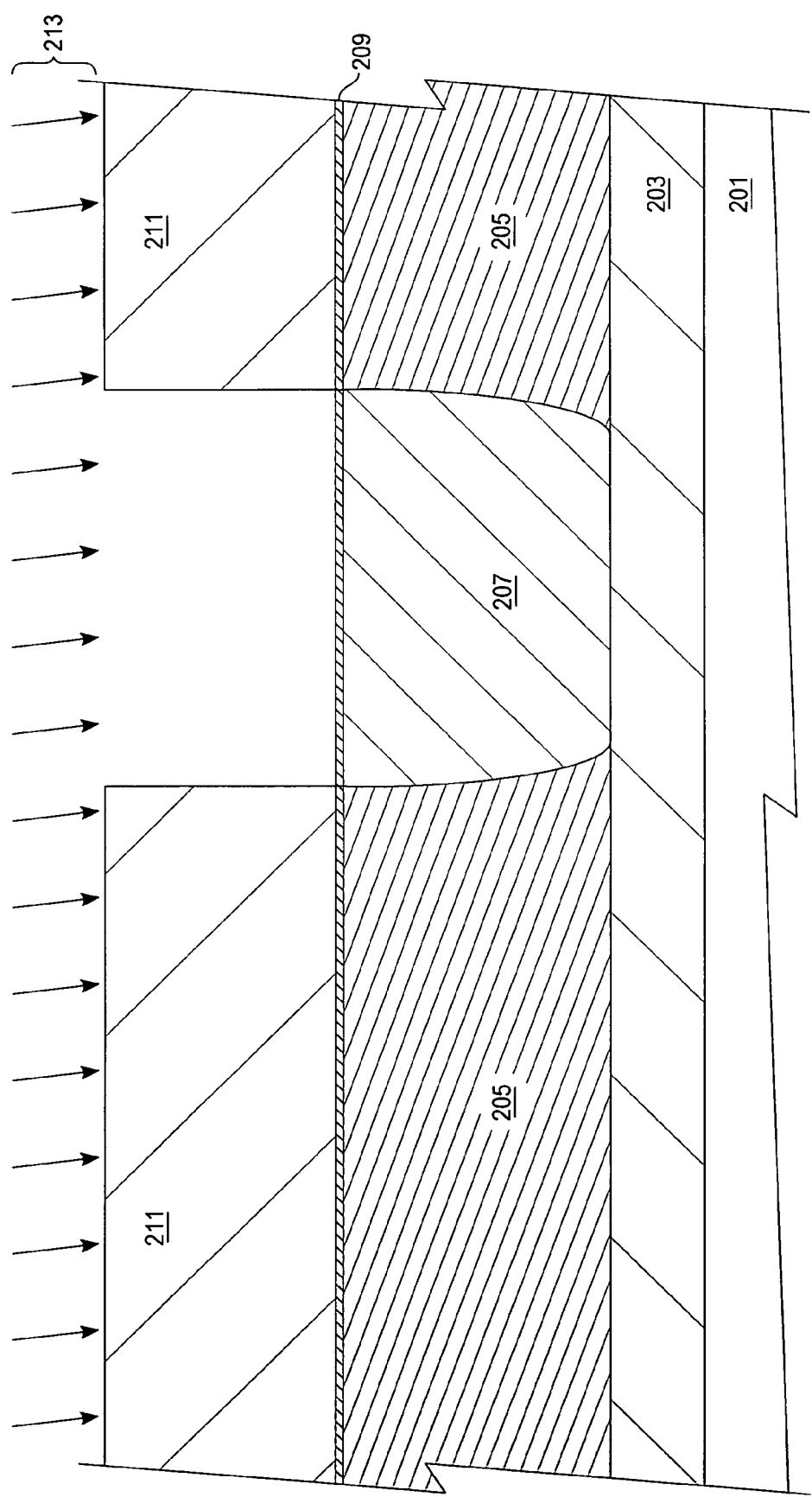
Fig._2A

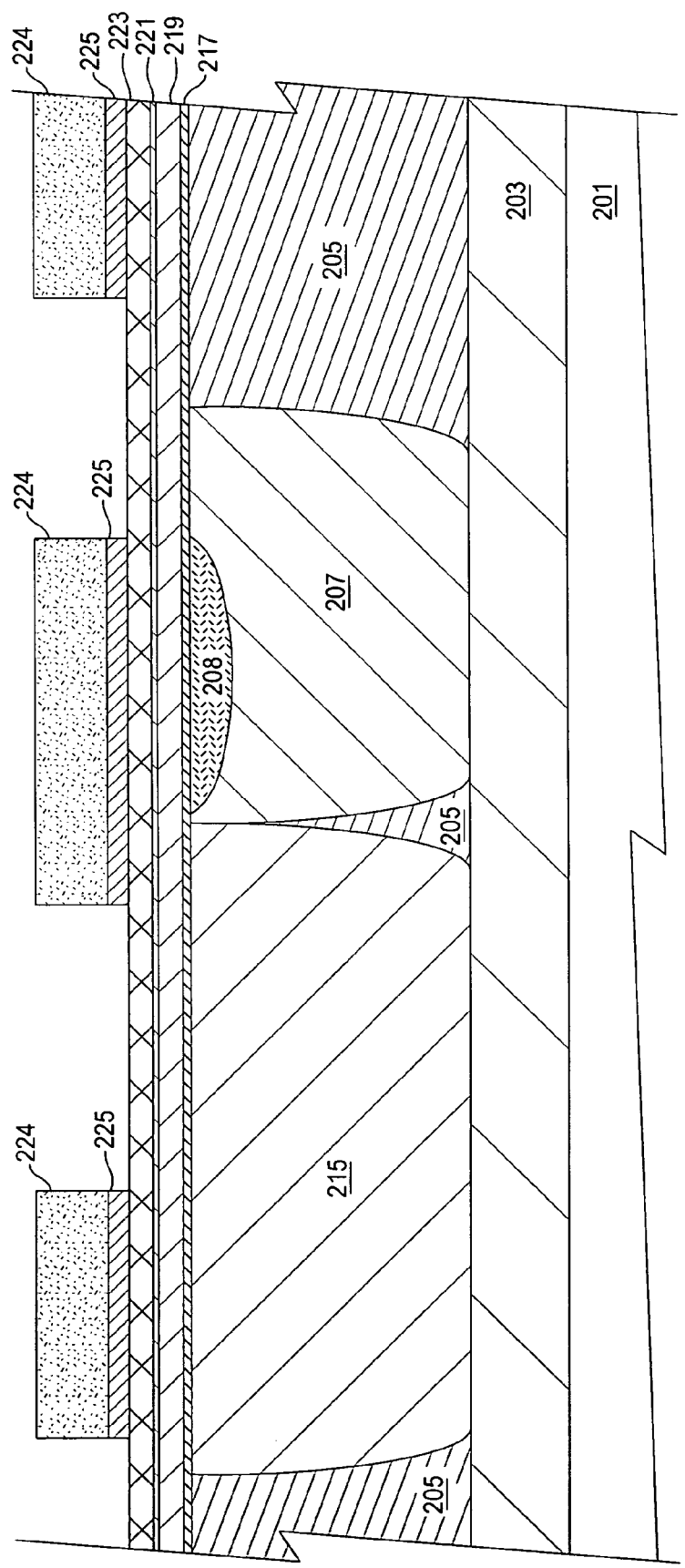
Fig._2B

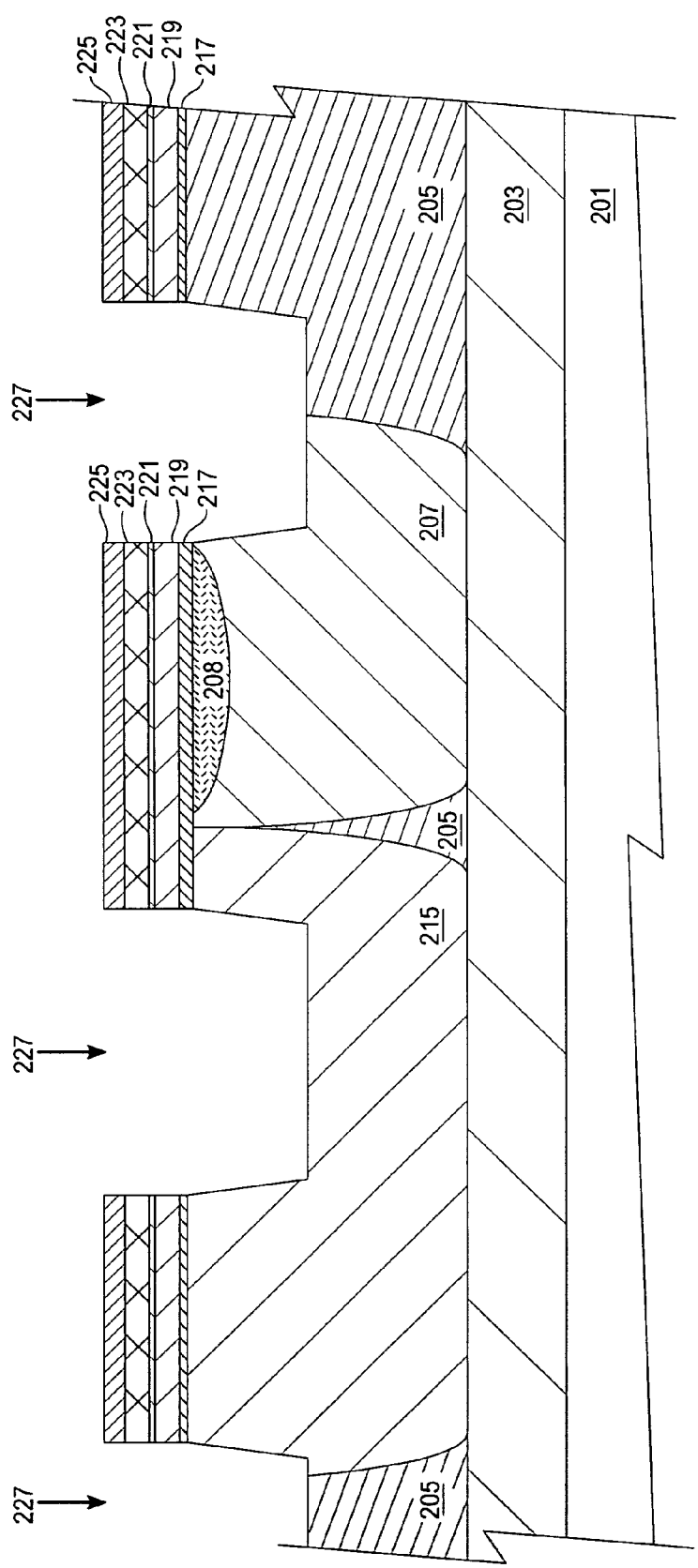
Fig._2C

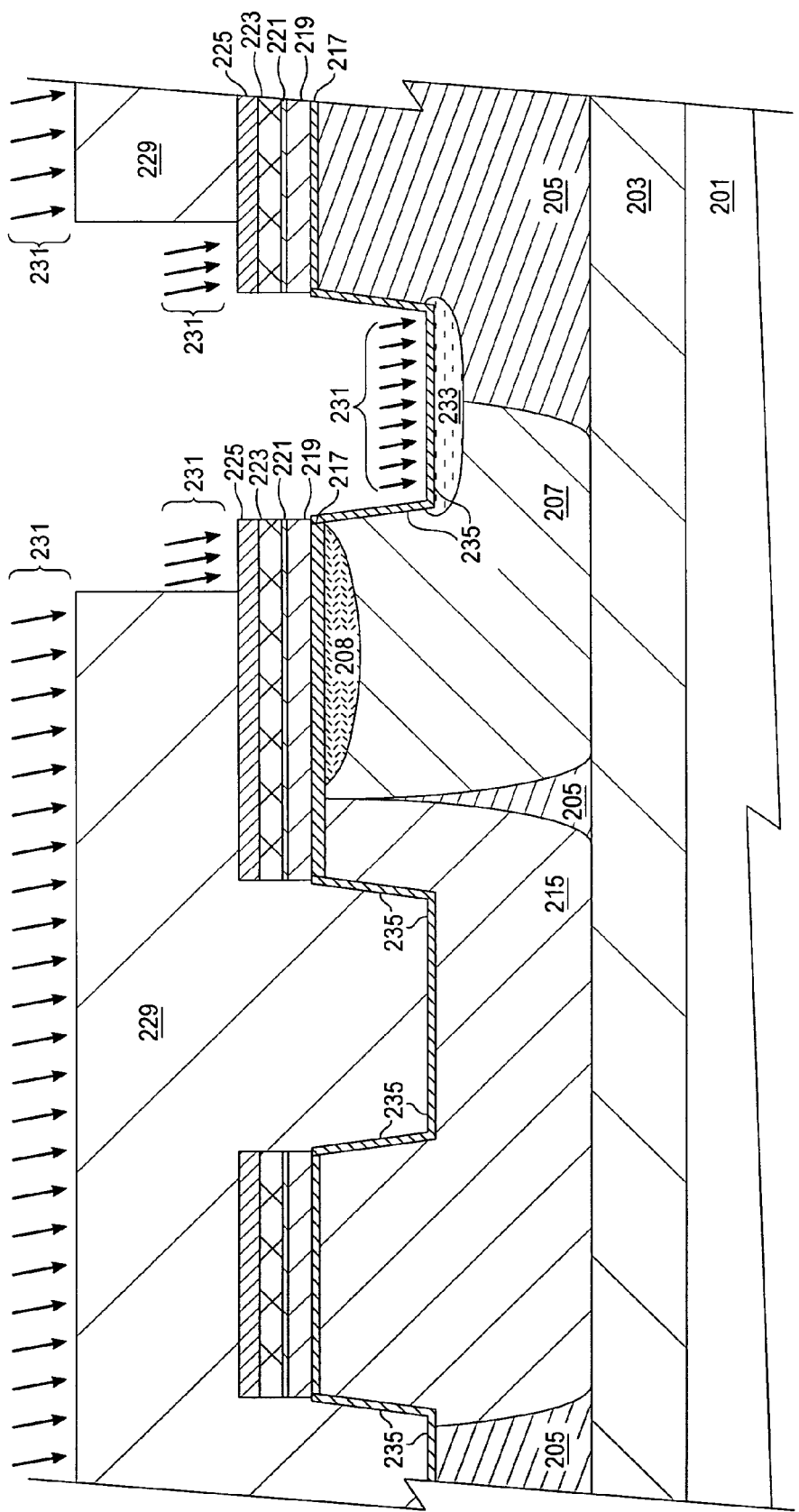
Fig._2D

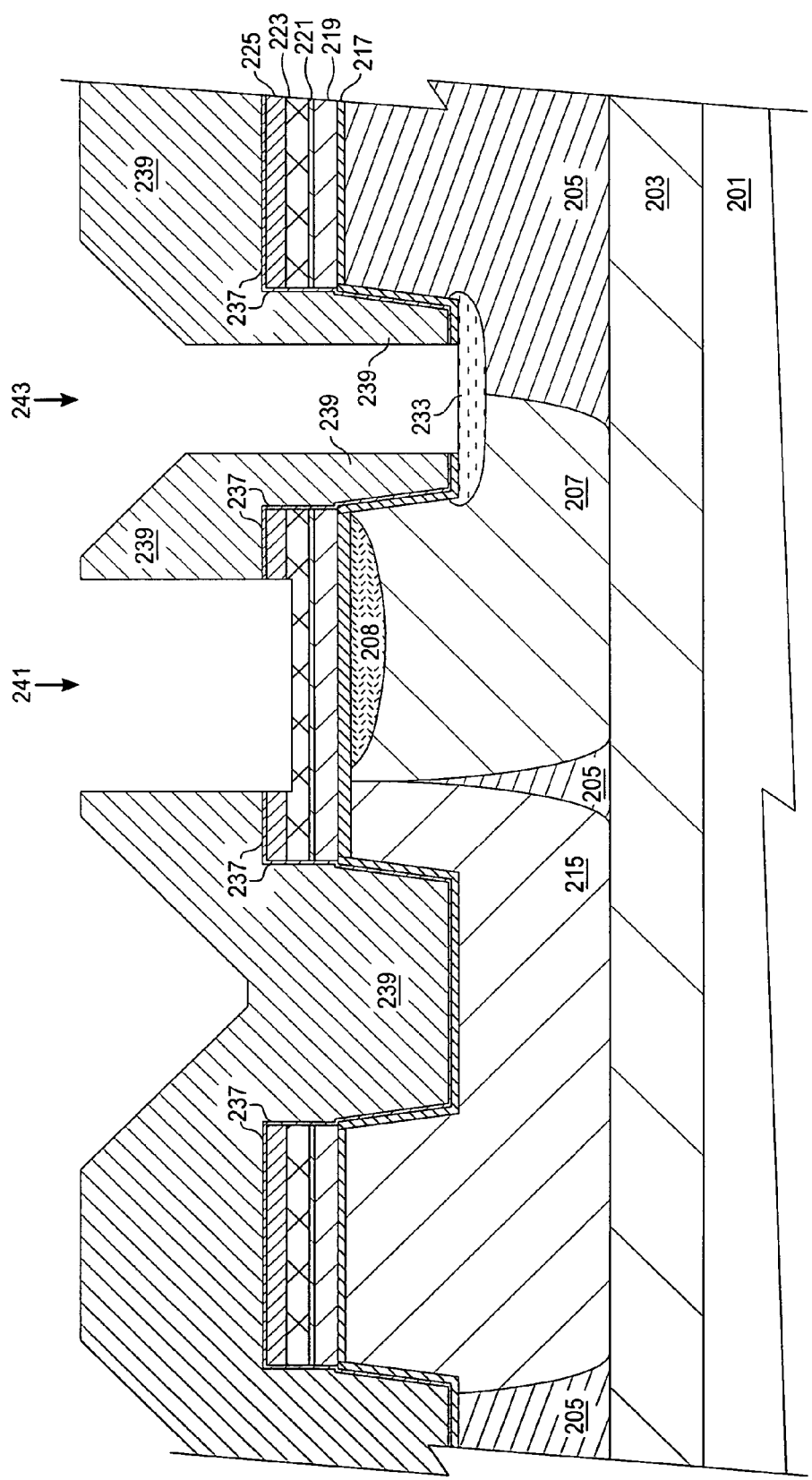
Fig._2E

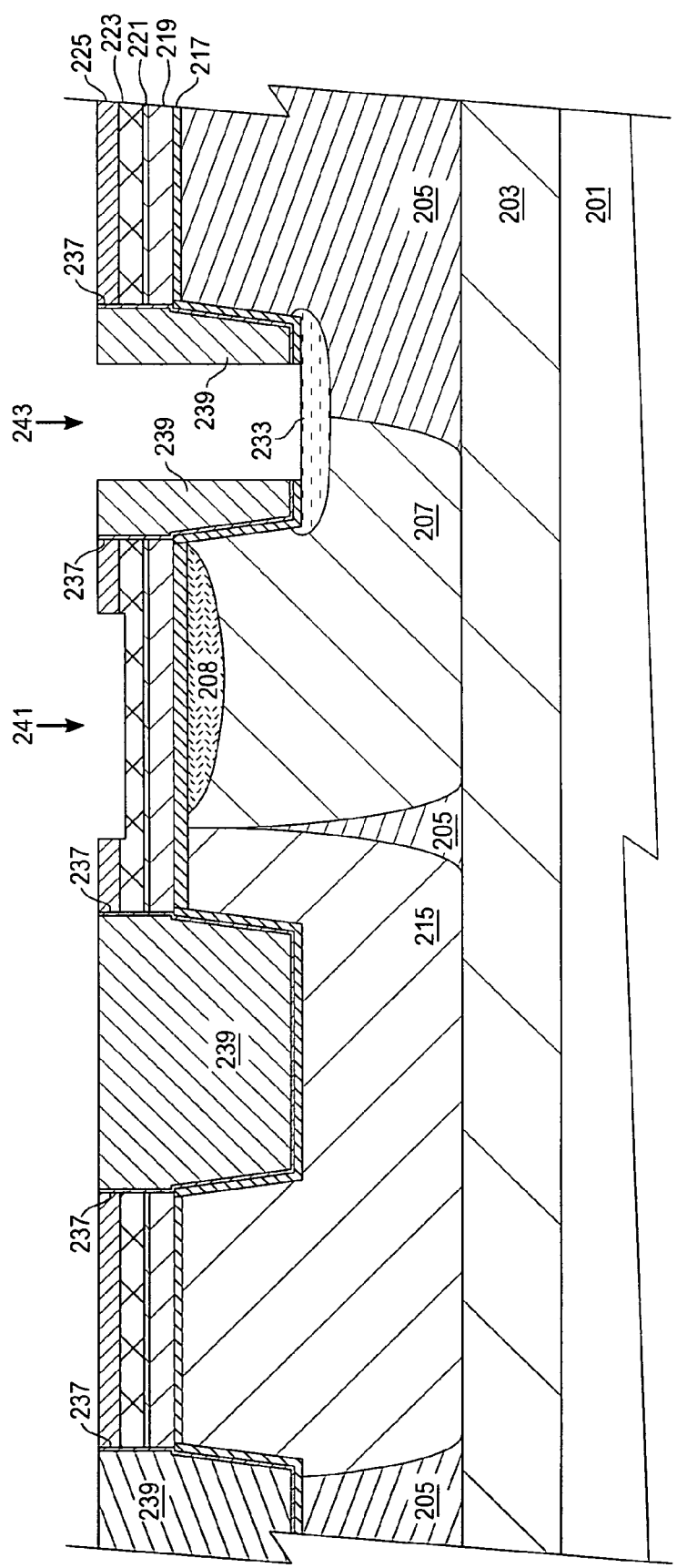
Fig. _2F

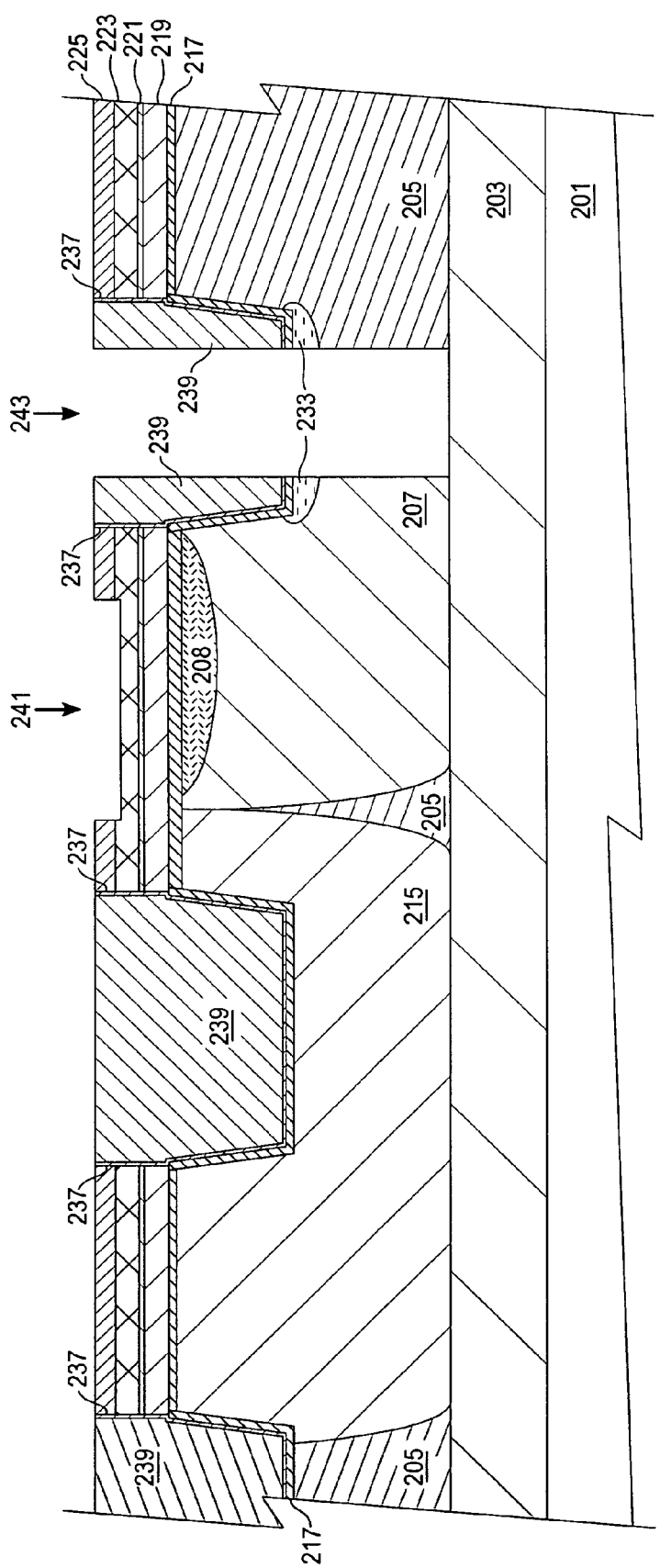

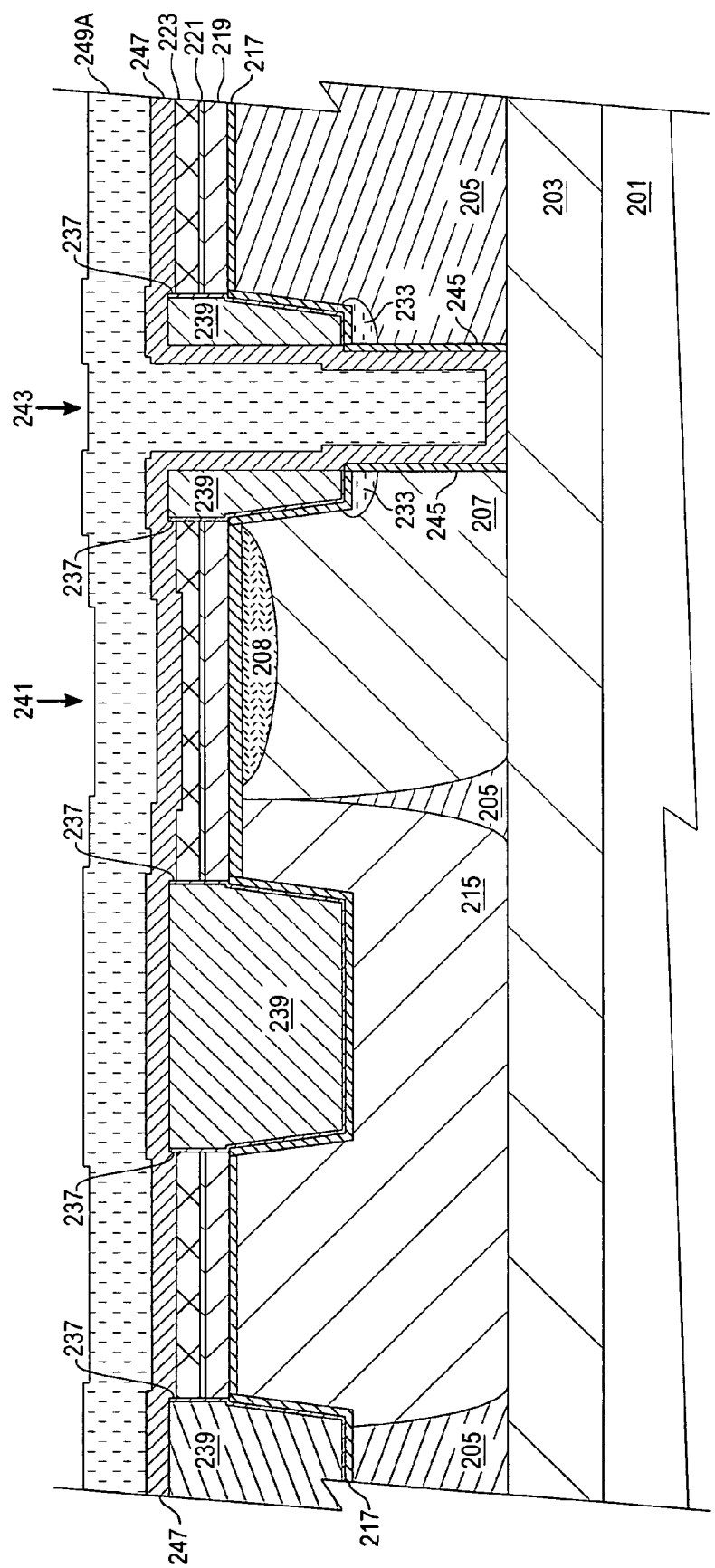
Fig._2I

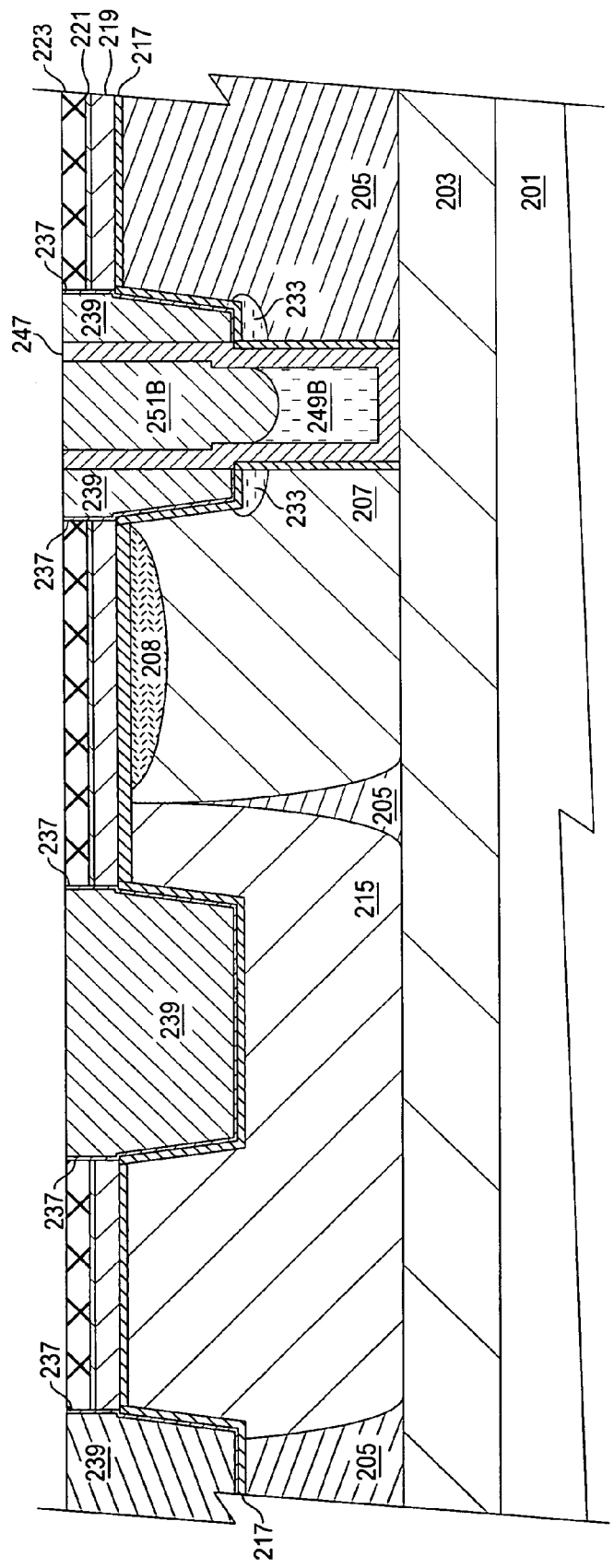
Fig._2L

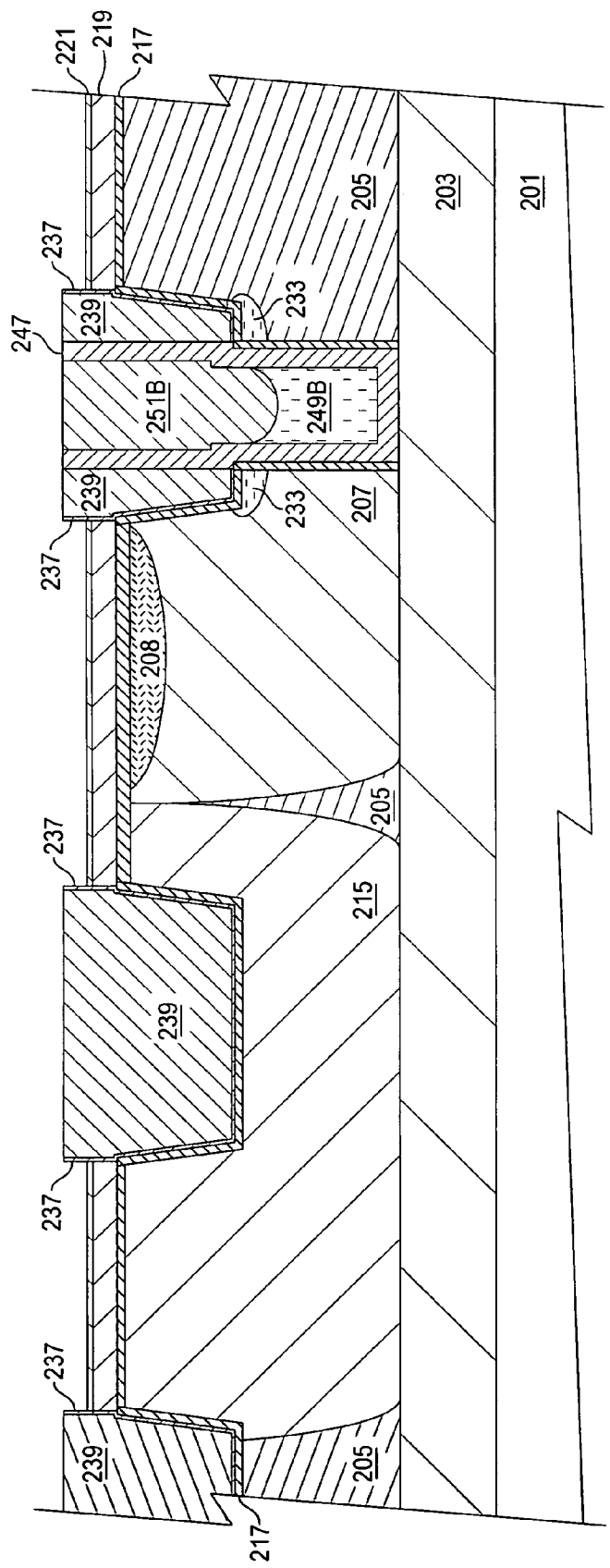
Fig._2M

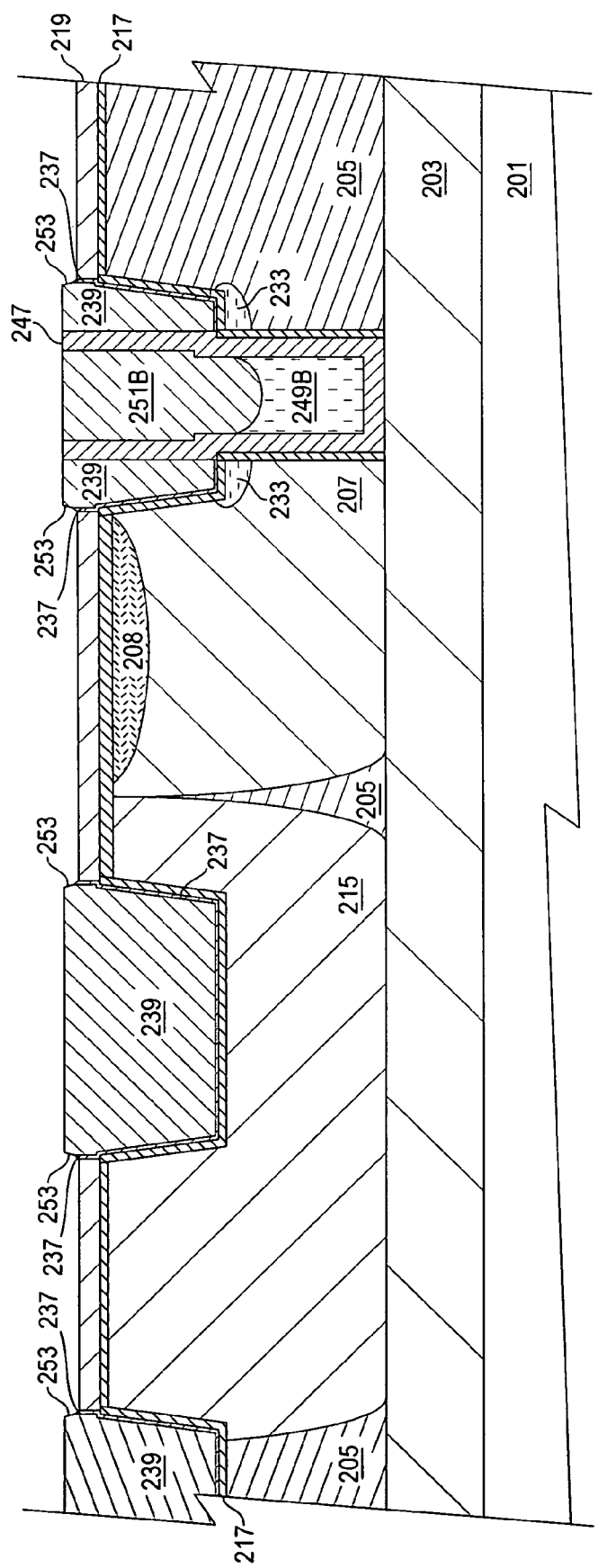
Fig._2N

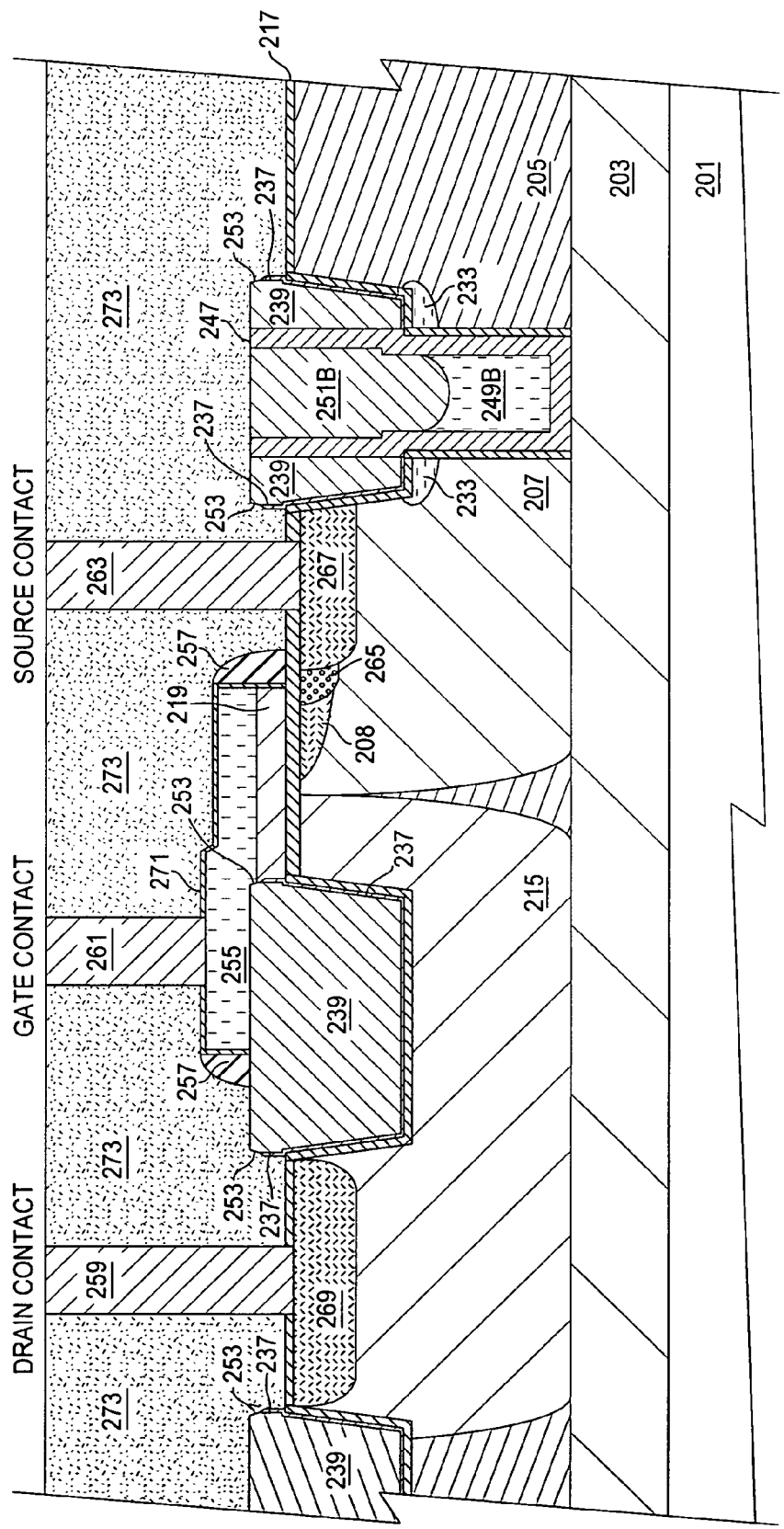
Fig._2P

METHODS OF FORMING REDUCED ELECTRIC FIELD DMOS USING SELF-ALIGNED TRENCH ISOLATION

TECHNICAL FIELD

The invention relates to electronic semiconductor devices and methods of fabrication, and, more particularly, to semiconductor devices and fabrication methods thereof for reducing electric fields and other deleterious effects by using self-aligned trench isolation techniques.

BACKGROUND ART

The electronics industry continues to rely upon advances in semiconductor technology to realize higher-functioning devices in more compact areas. For many applications, realizing higher-functioning devices requires integrating a large number of electronic devices into a single silicon die. As the number of electronic devices per given area of a silicon wafer increases, manufacturing processes employed become more difficult.

An important subject of ongoing research in the semiconductor industry is a reduction in the dimensions of devices used in integrated circuits. Planar transistors such as metal oxide semiconductor (MOS) transistors are particularly suited to use in high density integrated circuits. As a size of MOS transistors and other active devices decreases, dimensions of the source/drain/gate electrodes, and the channel region of each device, must decrease commensurately.

When fabricating MOS transistors, source and drain electrodes are typically heavily doped to reduce a parasitic resistance of the device. While doping improves conductance, it concurrently increases parasitic capacitance, and lowers breakdown voltages. Many prior art devices interpose lightly doped drain (LDD) regions on either side of the channel region, between the channel region and the source/drain electrodes. LDD regions permit MOS devices to develop adequate breakdown voltages. However, LDD regions also increase the resistance between the source and drain when the transistor is turned on. This increased parasitic resistance degrades the switching speed and current carrying capabilities of the transistor. The necessity of LDD regions also adds process steps to fabrication which negatively affect both cost and reliability.

A MOS transistor suitable to control the gating and amplification of high speed signals must have a low parasitic capacitance, low parasitic resistance, and a breakdown voltage larger than the signals which are carried. These performance parameters represent design trade-offs well known to those skilled in the art of MOS transistor fabrication.

Most prior art MOS transistors have channel regions that are substantially the same size as the overlying gate electrode. The channel region size and shape is a direct result of implanting dopants in the silicon underlying the gate electrode to form source/drain electrodes and LDD regions, after the deposition of the gate electrode. The wide channel region formed in such a process contributes undesirable characteristics to a transistor's performance. It is commonly acknowledged that the drain current is inversely proportional to the length of the channel.

DMOS (double diffused metal oxide semiconductor) transistors are well known as a type of MOSFET (metal on semiconductor field effect transistor) using diffusions to form the transistor regions, with a typical application being as a power transistor. Such devices enjoy widespread use in such applications such as automobile electrical systems, power supplies, and power management applications.

In a DMOS transistor, a channel length is determined by the higher rate of diffusion of the P body region dopant (typically boron) compared to the N+ source region dopant (typically arsenic or phosphorus). The channel as defined by the body region overlies a lightly doped drift region. DMOS transistors can have very short channels and typically do not depend on photolithography to determine channel length. Such DMOS transistors have good punch-through control because of the heavily doped P body shield. The lightly doped drift region minimizes the voltage drop across the channel region by maintaining a uniform field to achieve a velocity saturation. The field near the drain region is the same as in the drift region so that avalanche breakdown, multiplication, and oxide charging are lessened as compared to conventional MOSFETs.

In one type of DMOS transistor, a trench is used to form a gate structure. These transistors are typically formed on <100> oriented silicon substrates (wafers), using an anisotropic etch to form the trench. When etched into <100> silicon, the trench has 54.7 degree sidewall slopes. The doping distribution is the same as the DMOS transistor described supra. The two channels are located one on each side of the etched trench. The device has a common drain contact at the bottom portion of the substrate. Since many devices can be connected in parallel, DMOS transistors can handle high current and high power so are suitable for power switching applications as described previously.

Many different processes have been used for the fabrication of power MOSFET devices over the years; these processes are generally deep diffusion processes. It is well known to form such transistors having a trench in the substrate, the trench being lined with a thin oxide layer and filled with a conductive polysilicon to form the transistor gate structure.

With reference to FIG. 1, a cross-sectional view of one prior art MOS device 100 includes a silicon substrate 101, an nwell 103, a threshold implant 105, a gate oxide 107, a liner oxide 109, a shallow-trench isolation (STI) oxide 111, a gate polysilicon region 113, and a resultant gate wrap-around region 115. The gate wrap-around region 115 is a result of contemporaneous MOS processing techniques causing a "divot" at a periphery of the STI oxide 111, as is well-known in the art. The gate wrap-around region 115, however, has at least the following detrimental affects to MOS device performance: (1) isolation voltages between gate and drift regions of a device are reduced; and (2) the divot produces a high capacitance region between the gate and drift regions, thereby creating a high local-electric field. Therefore, what is needed is an economical method to produce a MOS device while eliminating the deleterious effects of the gate wrap-around region by eliminating the divot during processing.

SUMMARY OF THE INVENTION

The present invention is, in one embodiment, a semiconductor electronic device fabricated using the method described herein. The semiconductor electronic device is, for example, a reduced-electric field DMOS having a source, a drain, and a gate with a shallow trench isolation feature. The shallow trench isolation feature has a trench-fill dielectric where the trench-fill dielectric maintains an essentially full-field oxide thickness. The full-field oxide thickness is partially formed by having an uppermost sidewall area of the trench-fill dielectric in electrical communication with a polysilicon gate layer, thereby eliminating a gate wrap-around area of the prior art.

The present invention is also a method of fabricating an electronic device. The method includes, for example, forming a gate oxide on an uppermost side of a silicon-on-insulator substrate; forming a first polysilicon layer over the gate oxide; and forming a first silicon dioxide layer over the first polysilicon layer. A first silicon nitride layer is then formed over the first silicon dioxide layer. The first nitride layer is chosen since a high selectivity ratio etchant can be used in later processing steps to etch the nitride at a different rate from the silicon dioxide layer. A second silicon dioxide layer is then formed over the first nitride. Shallow trenches are etched through all the preceding dielectric layers and into the SOI substrate. The etched trenches are filled with another dielectric layer (e.g., silicon dioxide). The dielectric layer (i.e., the trench-fill) is planarized to be substantially coplanar with an uppermost surface of the nitride layer. Each of the preceding dielectric layers are then removed, leaving an uppermost sidewall area of the dielectric layer. The sidewall area assures a full-field oxide thickness thereby producing a device with a reduced-electric field and a reduced capacitance between gate and drift regions.

Due to the aforementioned attributes and processing methods, the present invention is, inter alia, capable of attaining a higher isolation voltage between gate and drift regions than the prior art without degrading a trajectory of injected carriers or forcing them deeper into the body of the device. Also, the structure of the resulting device allows for a greatly reduced capacitance between the device gate and drift region with an elimination of the "gate wrap-around," thereby reducing a local electric field.

BRIEF DESCRIPTION OF THE DRAWINGS

FIG. 1 is a cross-sectional view of a gate region in a prior art MOS device.

DETAILED DESCRIPTION OF THE INVENTION

Figure 2H:
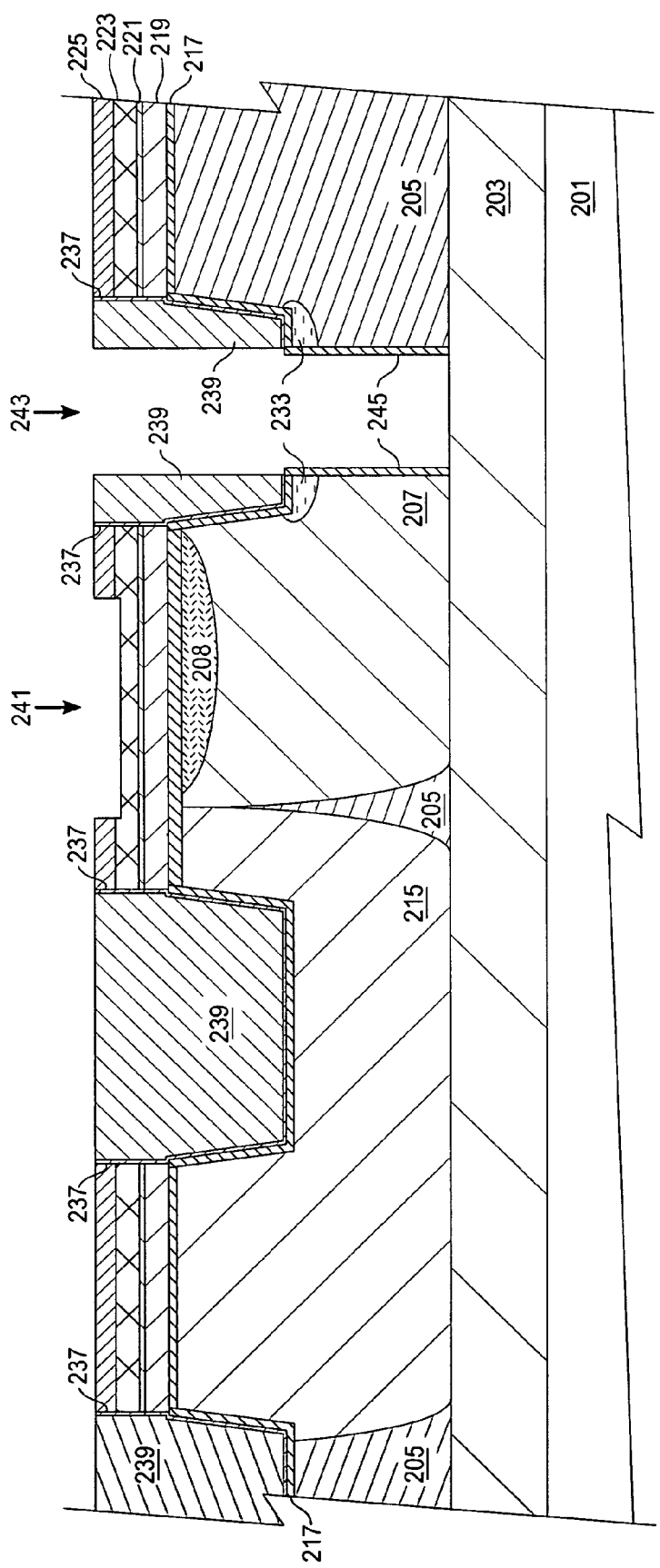
FIGS. 2A-2P show various cross-sectional views of a reduced electric field MOS device fabricated using exemplary fabrication techniques of the present invention.

With reference to FIG. 2A, beginning exemplary processes of the present invention utilize a silicon-on-insulator (SOI) technique and include a substrate 201, an oxide isolation layer 203, and an SOI layer 205. A screen oxide 209 is either thermally grown or deposited on the SOI layer 205. A patterned and etched photoresist layer 211 provides a mask for an ion implantation step. In a specific embodiment, a concentration of boron atoms 213 forms a retrograde p-well 207, thus forming a body for an NMOS device. A skilled artisan will recognize that other doping techniques, such as diffusion, may also be readily employed to produce a similar p-well area.

In this exemplary embodiment, the substrate 201 is a silicon wafer. Alternatively, the substrate 201 could be another elemental group IV semiconductor or a compound semiconductor (e.g., groups III-V or II-VI). The substrate 201 may alternatively be a non-semiconductor, such as a photomask blank.

In FIG. 2B, additional dopant areas have been added after removal of the patterned and etched photoresist layer 211 and the screen oxide 209 (neither of which is shown in FIG. 2B). The additional dopant areas include an n-well 215 and a threshold enhancing implant 208. Further, a gate oxide 217, a first polysilicon layer 219, a first oxide layer 221, and a silicon nitride layer 223 have been deposited by various techniques, all known to a skilled artisan. The first polysilicon layer 219, the first oxide layer 221, and the silicon nitride layer 223 comprise an active stack.

In a specific embodiment, the gate oxide 217 is thermally grown and/or etched to various thicknesses in different regions, generally 20 Å to 50 Å thick. The first polysilicon layer 219 is deposited via chemical vapor deposition (CVD) to about 1200 Å thick, and the first oxide layer 221 is thermally grown and is about 90 Å thick. The silicon nitride layer 223 is deposited via a CVD process and is about 1200 Å thick.

Over the active stack (i.e., the first polysilicon layer 219, the first oxide layer 221, and the silicon nitride layer 223), a second oxide layer 225 and a photoresist layer 224 are patterned and etched to act as a hardmask for subsequent shallow trench isolation (STI) processes (described infra). The second oxide layer 225 may be a high density plasma (HDP)—enhanced CVD, with an average thickness of approximately 2000 Å that is dry-etched (e.g., a reactive-ion etch) in preparation for the subsequent STI processes.

In FIG. 2C, shallow trenches 227 have been etched through the active stack and the gate oxide 217 and into the SOI layer 205 as part of the STI process. The photoresist layer 224 (not shown in FIG. 2C) is subsequently removed. A liner oxide 235 (FIG. 2D) is deposited or grown onto exposed sidewalls of the shallow trenches 227, followed by a third photoresist layer 229. The third photoresist layer 229 is then patterned and etched (as shown in FIG. 2D) and a second ion implant 231 is performed, producing a p-field implant 233. The third photoresist layer 229 is then stripped, and a second liner oxide 237 (FIG. 2E) is deposited. In a specific embodiment, the second liner oxide 237 is silicon dioxide grown by a pyrolitic oxidation of tetraethylorthosilane (TEOS) to a thickness of approximately 200 Å). A third oxide layer 239 is then conformally deposited (e.g., by an HDP-CVD process to approximately 9000 Å) providing a shallow trench fill. The third oxide layer 239 is etched (typically with an etchant which has a high selectivity ratio between silicon dioxide and silicon nitride), producing a first trench 241 and a second trench 243, followed by a chemical mechanical planarization (CMP) process step. The CMP process step stops at an uppermost portion of the silicon nitride layer 223 (FIG. 2F).

With reference to FIG. 2G, the second trench 243 is etched and extended at least partially through the p-field implant 233, the p-well 207, and the SOI layer 205. In a specific embodiment, the second trench 243 is extended to an uppermost surface of the oxide isolation layer 203. A third liner oxide 245 (FIG. 2H) is then thermally grown on exposed silicon sidewalls of a lower portion of the extended second trench 243.

Figure 2J:
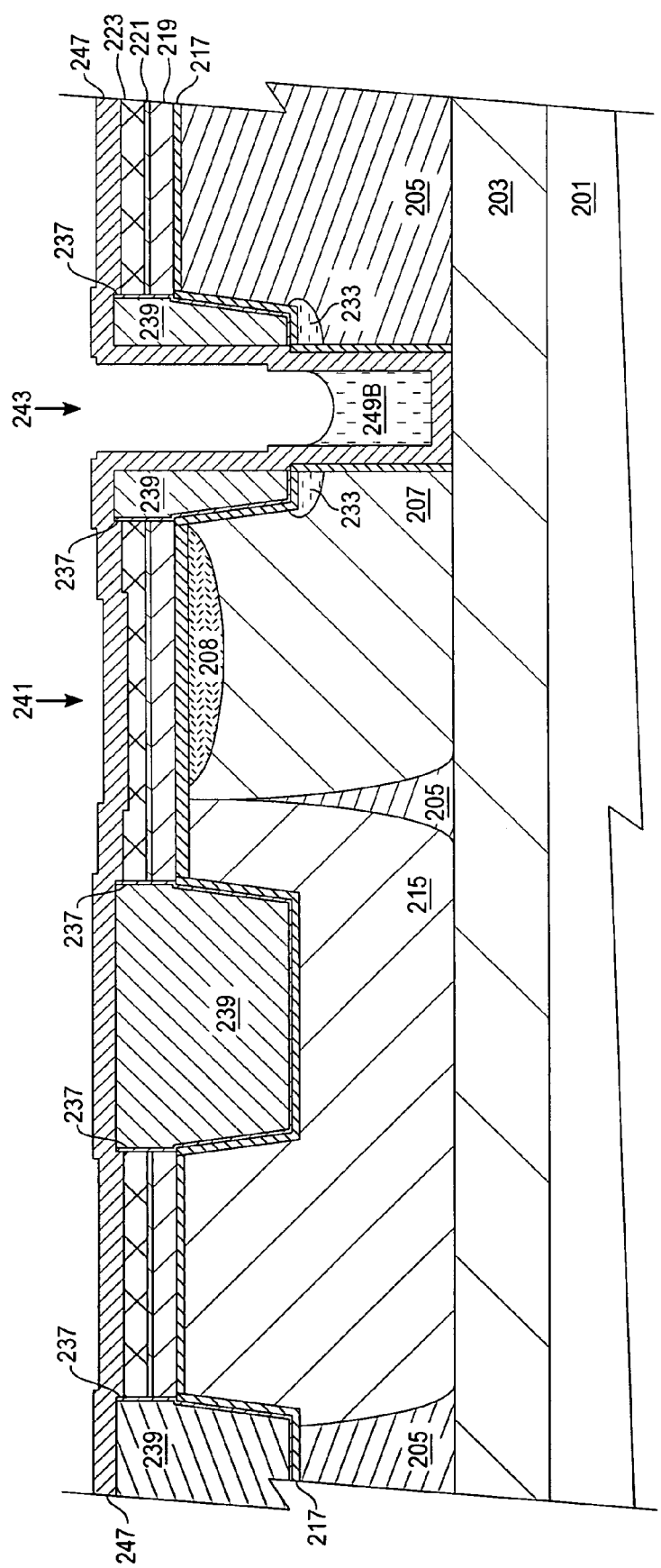
Figure 2K:
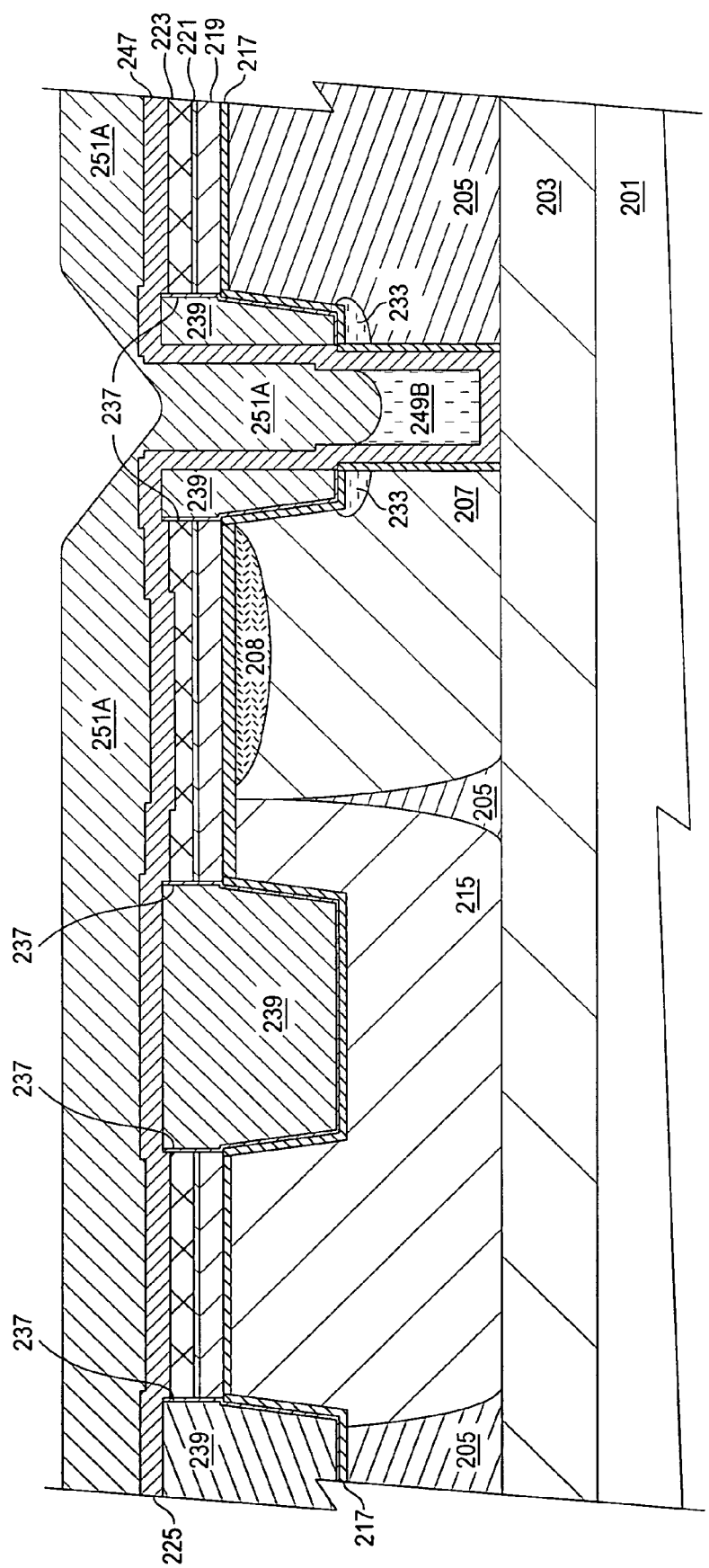
Figure 20:
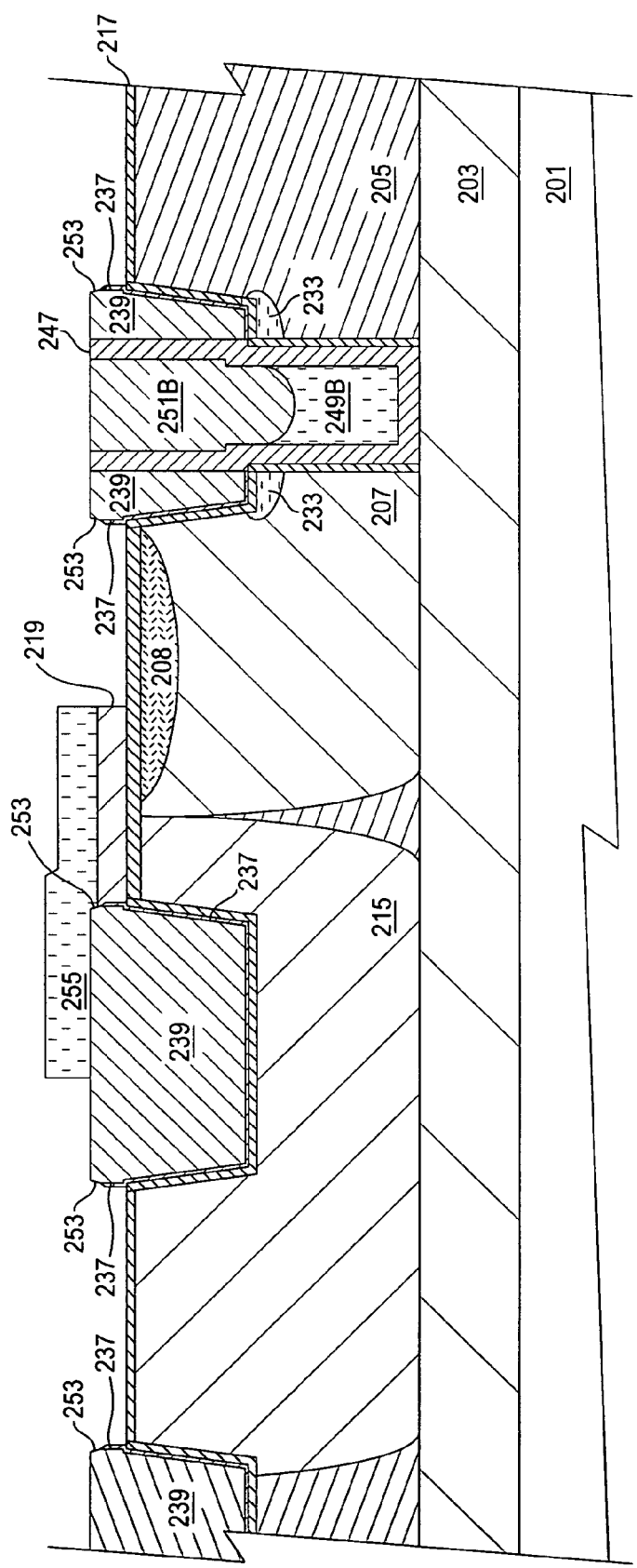

With reference to FIG. 2I, a conformal TEOS layer 247 is deposited (e.g., to approximately 2000 Å thick), followed by a blanket polysilicon layer 249A. The blanket polysilicon layer 249A, is deposited to a thickness of, for example, 5000 Å. The blanket polysilicon layer 249A is then etched (FIG. 2J), leaving a deep trench fill plug 249B. A subsequent HDP-CVD oxide layer 251A is deposited (FIG. 2K) to a depth of approximately 7000 Å. An additional CMP step planarizes the wafer, stopping on the silicon nitride layer 223 (FIG. 2L). An oxide remainder 251B of the HDP-CVD oxide layer 251A stays in the second trench 243 (now filled in) above and in contact with the deep trench polysilicon plug 249B.

After CMP, the silicon nitride layer 223 is etched (e.g., by hot phosphoric acid), leaving an upper portion of the shallow trench isolation areas (comprised of the second liner oxide 237 and the third oxide layer 239) partially exposed (FIG. 2M). A buffered-oxide etch dip-back removes a remaining portion of the first oxide layer 221 and provides a rounded area on an uppermost edge of the STI corners 253 (FIG. 2N).

In FIG. 2O, a second polysilicon layer 255 is deposited (e.g., to approximately a 2000 Å thickness), patterned, and etched. The second polysilicon layer 255 will form a gate area of the MOS device.

With reference to FIG. 2P, fabrication of the MOS device proceeds by adding an n-type lightly doped drain (NLDD) implant 265, a source area n-type source-drain (NSD) implant 267, and a drain area NSD implant 269. An oxide-isolation layer 271 is added to the second polysilicon layer 255, nitride sidewall spacers 257 are added to a periphery of the polysilicon layer 255, and a thick dielectric 273 is deposited. Contact vias 259, 261, 263 are defined for drain, gate, and source contacts respectively. Each of the vias 259, 261,263 is subsequently tungsten filled to complete the contact. All of these final fabrication processes are known to one of skill in the art.

Figure 3:
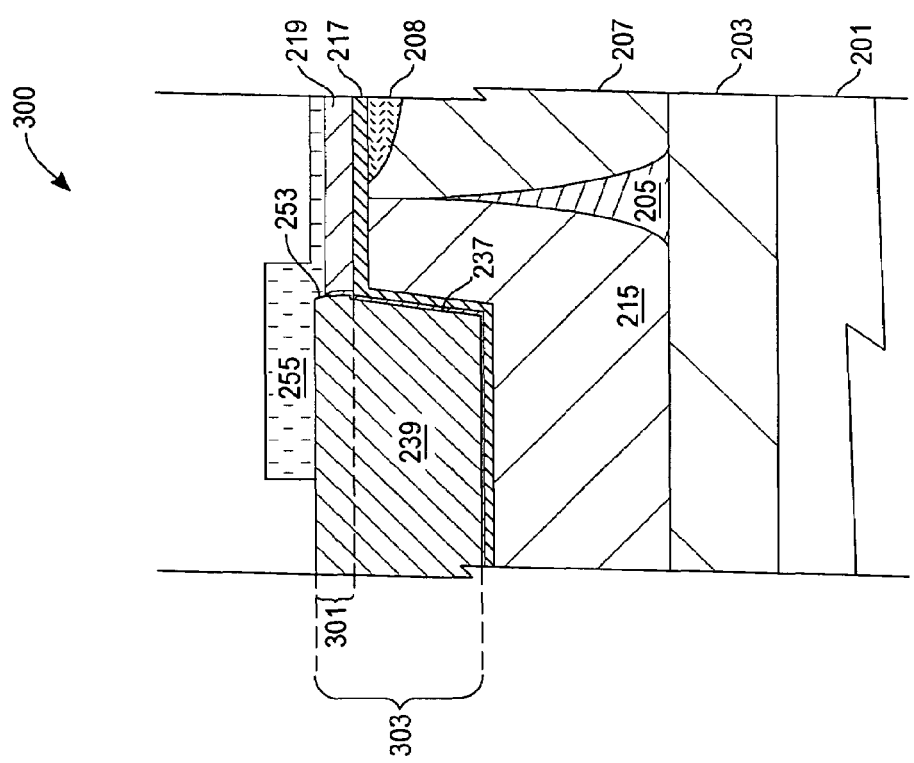
FIG. 3 is a portion of a gate region of the MOS device of FIG. 2P.

With reference to FIG. 3, a portion 300 of the MOS device of FIG. 2P indicates a first area 301 in which a capacitance between the gate and drift regions of the MOS device is greatly reduced as compared with a similar region of the prior art MOS device 100 (FIG. 1). Further, the gate wrap-around 115 of the prior art MOS device 100 has been eliminated by utilizing the fabrication techniques of the present invention. Additionally, a second area 303 of FIG. 3 indicates that a full field oxide thickness is maintained. The full field thickness aids in optimizing performance characteristics of the MOS device of the present invention.

In the foregoing specification, the present invention has been described with reference to specific embodiments thereof. For example, various doping processes are described in terms of implants. A skilled practitioner will realize that another doping process, such as diffusion, may be substituted for the implant process. Also, various layers may be defined as being comprised of a given material, for example, silicon dioxide. A skilled practitioner will realize that another dielectric material may often be substituted. For example, a silicon dioxide layer may be interchanged with a silicon nitride layer as long as each adjacent dielectric layer has a different etch rate (e.g., a high selectivity wet-etch process will etch silicon dioxide more rapidly than silicon nitride or vice versa). Also, various types of silicon dioxide may be used even though the characteristics are all somewhat similar to each other (e.g., dielectric breakdown or permittivity). Thus, silicon dioxide layers formed by thermal growth, chemical vapor deposition, or TEOS techniques may be considered similar for an application of the present invention. It will, therefore, be evident that various modifications and changes can be made thereto without departing from the broader spirit and scope of the present invention as set forth in the appended claims. The specification and drawings are, accordingly, to be regarded in an illustrative rather than a restrictive sense.

What is claimed is:

1. A method of fabricating an electronic device, the method comprising:
    forming a gate oxide on an uppermost side of a substrate;
    forming a first polysilicon layer over the gate oxide;
    forming a first dielectric layer over the first polysilicon layer, the first dielectric layer being of a first dielectric type;
    forming a second dielectric layer over the first dielectric layer, the second dielectric layer comprised of a material that may be selectively etched at a rate different from the first dielectric layer;
    forming a third dielectric layer over the second dielectric layer, the third dielectric layer being of a same or similar dielectric as the first dielectric layer;
    etching shallow trenches through the gate oxide layer, the polysilicon layer, each of the dielectric layers, and into the substrate;
    filling the etched trenches with a fourth dielectric layer;
    forming the fourth dielectric layer to be substantially coplanar with an uppermost surface of the third dielectric layer;
    removing the first dielectric layer;
    removing the second dielectric layer; and
    removing the third dielectric layer, removal of the first, second, and third dielectric layers thereby exposing an uppermost sidewall area of the fourth dielectric layer; and
    forming a second polysilicon layer.

2. The method of claim 1 wherein the substrate is comprised of a semiconducting material.

3. The method of claim 1 wherein the substrate is silicon on insulator.

4. The method of claim 1 further comprising:
    forming a liner dielectric layer on bottom and sidewalls of the shallow trenches prior to filling the trenches with the fourth dielectric layer;
    performing a chemical mechanical planarization step after forming the fourth dielectric to effect planarization;
    depositing a TEOS layer after removing the first dielectric layer; and
    planarizing the TEOS layer to a top of the uppermost portion of the fourth dielectric layer.

5. The method of claim 1 wherein the fourth dielectric layer is formed such that no gate wrap-around is formed.

6. The method of claim 1 wherein the first dielectric layer is comprised of silicon dioxide.

7. The method of claim 1 wherein the second dielectric layer is comprised of silicon nitride.

8. The method of claim 1 wherein the third dielectric layer is comprised of silicon dioxide.

9. The method of claim 1 wherein the fourth dielectric layer is comprised of silicon dioxide.

10. The method of claim 1 wherein the etching step is performed using an etchant with a high selectivity ratio between the third dielectric layer and the second dielectric layer.

11. A method of fabricating an electronic device, the method comprising:
    forming a gate oxide on an uppermost side of a substrate;
    forming a first polysilicon layer over the gate oxide;
    forming a first dielectric layer over the first polysilicon layer, the first dielectric layer being of a first dielectric type;
    forming a second dielectric layer over the first dielectric layer, the second dielectric layer comprised of a material that may be selectively etched in at a rate different from the first dielectric layer;
    forming a third dielectric layer over the second dielectric layer, the third dielectric layer being of a same or similar dielectric as the first dielectric layer;

etching shallow trenches through the gate oxide layer, the polysilicon layer, each of the dielectric layers, and into the substrate;

filling the etched trenches with a fourth dielectric layer;

forming the fourth dielectric layer to be substantially coplanar with an uppermost surface of the third dielectric layer;

removing the first dielectric layer;

removing the second dielectric layer;

removing the third dielectric layer, removal of the first, second, and third dielectric layers thereby exposing an uppermost sidewall area of the fourth dielectric layer;

depositing a second polysilicon layer over the fourth dielectric layer, the second polysilicon layer formed to be in electrical communication with the uppermost sidewall area of the fourth dielectric layer; and forming a gate area from the second polysilicon layer.

12. The method of claim 11 wherein the substrate is comprised of a semiconducting material.

13. The method of claim 11 wherein the substrate is silicon on insulator.

14. The method of claim 11 further comprising:

forming a liner dielectric layer on bottom and sidewalls of the shallow trenches prior to filling the trenches with the fourth dielectric layer;

performing a chemical mechanical planarization step after forming the fourth dielectric to effect planarization;

depositing a TEOS layer after removing the first dielectric layer; and planarizing the TEOS layer to a top of the uppermost portion of the fourth dielectric layer.

15. The method of claim 11 wherein the fourth dielectric layer is formed such that no gate wrap-around is formed.

16. The method of claim 11 wherein the fourth dielectric layer is formed such that no gate wrap-around is formed.

17. The method of claim 11 wherein the first dielectric layer is comprised of silicon dioxide.

18. The method of claim 11 wherein the second dielectric layer is comprised of silicon nitride.

19. The method of claim 11 wherein the third dielectric layer is comprised of silicon dioxide.

20. The method of claim 11 wherein the fourth dielectric layer is comprised of silicon dioxide.

21. The method of claim 11 wherein the etching step is performed using an etchant with a high selectivity ratio between the third dielectric layer and the second dielectric layer.

* * * * *

UNITED STATES PATENT AND TRADEMARK OFFICE
CERTIFICATE OF CORRECTION

PATENT NO. : 7,348,256 B2 Page 1 of 1
APPLICATION NO. : 11/188921
DATED : March 25, 2008
INVENTOR(S) : Miller et al.

It is certified that error appears in the above-identified patent and that said Letters Patent is hereby corrected as shown below:

In column 2, line 40, delete "nwell" and insert -- n-well --, therefor.

In column 4, line 40, delete "Å)." and insert -- Å. --, therefor.

Signed and Sealed this

First Day of July, 2008

JON W. DUDAS
*Director of the United States Patent and Trademark Office*